(12) United States Patent
Hirabayashi

(10) Patent No.: US 7,885,125 B2
(45) Date of Patent: Feb. 8, 2011

(54) SEMICONDUCTOR MEMORY DEVICE HAVING INTEGRATED DRIVING WORD LINE INTERMEDIATE VOLTAGES BY PULL-UP CIRCUITS

(75) Inventor: Osamu Hirabayashi, Suginami-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 33 days.

(21) Appl. No.: 12/435,693

(22) Filed: May 5, 2009

(65) Prior Publication Data

US 2009/0296497 A1 Dec. 3, 2009

(30) Foreign Application Priority Data

May 28, 2008 (JP) ............... 2008-139003

(51) Int. Cl.
*G11C 7/00* (2006.01)
(52) U.S. Cl. ............... 365/189.11; 365/189.09; 365/225.7
(58) Field of Classification Search ............ 365/189.11, 365/189.08, 189.03, 189.09, 225.7, 230.06, 365/226
See application file for complete search history.

(56) References Cited

U.S. PATENT DOCUMENTS 6,449,192 B2 * 9/2002 Otsuka ............... 365/185.23
2008/0031060 A1 * 2/2008 Choi et al. ............ 365/189.11
2008/0112213 A1 * 5/2008 Wu et al. ................. 365/154

OTHER PUBLICATIONS

J. Pille, et al., "Implementation of the CELL Broadband Engine™ in a 65nm SOI Technology Featuring Dual-Supply SRAM Arrays Supporting 6GHz at 1.3V", 2007 IEEE International Solid-State Circuits Conference, Digest of Technical Papers, Feb. 13, 2007, pp. 322-323.

* cited by examiner

*Primary Examiner*—Richard Elms
*Assistant Examiner*—Hien N Nguyen
(74) *Attorney, Agent, or Firm*—Oblon, Spivak, McClelland, Maier & Neustadt, L.L.P.

(57) ABSTRACT

A semiconductor memory device comprises a logic circuit supplied with a first supply voltage; a cell array supplied with a second supply voltage higher than the first supply voltage and including plural mutually intersecting word lines and bit lines and plural memory cells connected at intersections thereof; and a word line driver operative to drive the word lines. The word line driver includes plural pull-up circuits connected between the supply terminal of the first supply voltage and the drive terminal of the word line and between the supply terminal of the second supply voltage and the drive terminal of the word line, and a pull-down circuit connected between the drive terminal of the word line and the ground terminal, and drives the word line with an intermediate voltage between the first and second supply voltages in accordance with a driving force ratio between the plural pull-up circuits at the time of driving the word line.

20 Claims, 9 Drawing Sheets

SEMICONDUCTOR MEMORY DEVICE HAVING INTEGRATED DRIVING WORD LINE INTERMEDIATE VOLTAGES BY PULL-UP CIRCUITS

CROSS-REFERENCE TO RELATED APPLICATION

This application is based upon and claims the benefit of priority from the prior Japanese Patent Application No. 2008-139003, filed on May 28, 2008, the entire contents of which are incorporated herein by reference.

BACKGROUND OF THE INVENTION

1. Field of the Invention

The present invention relates to a semiconductor memory device, and more particularly to an SRAM powered from two systems, including a logic-use power source and a memory cell-use power source.

2. Description of the Related Art

LSIs used in mobile instruments are required to reduce power consumption for achieving a longer drive time with a battery. Power consumption can be effectively reduced by lowering the supply voltage though the increase in characteristic variation among elements due to the recent progression of scaling results in a reduced operation margin of an SRAM used in the LSI, which makes it difficult to lower the operation voltage of the SRAM. In this case, the supply voltage to the entire LSI can not be lowered as a problem.

To address such the problem, a method for supplying a higher supply voltage than a logic-use supply voltage only to memory cells has been used (Non-Patent Document 1: J. Pille, et al., 2007 IEEE International Solid-State Circuits Conference Digest of Technical Papers, p322). In this case, it is possible to lower the logic-use supply voltage down to or lower than the operation voltage of the SRAM and accordingly suppress the power consumption in the LSI.

A further progression of device scaling, however, increasingly enlarges the estrangement between the memory cell-use power source and the logic-use power source. A rise in the memory cell-use supply voltage increases the current consumption in the memory cell-use power source. Accordingly, even a lowered logic-use supply voltage can not suppress the current consumption in the entire LSI sufficiently. The applicable supply voltage has an upper limit because of the reliability of the device. Accordingly, even the use of the memory cell-use power source can not ensure a sufficient operation margin.

SUMMARY OF THE INVENTION

In an aspect the present invention provides a semiconductor memory device, comprising: a logic circuit supplied with a first supply voltage; a cell array supplied with a second supply voltage higher than the first supply voltage and including plural mutually intersecting word lines and bit lines and plural memory cells connected at intersections thereof; and a word line driver operative to drive the word lines. The word line driver includes plural pull-up circuits connected between the supply terminal of the first supply voltage and the drive terminal of the word line and between the supply terminal of the second supply voltage and the drive terminal of the word line, and a pull-down circuit connected between the drive terminal of the word line and the ground terminal, and drives the word line with an intermediate voltage between the first and second supply voltages in accordance with a driving force ratio between the plural pull-up circuits at the time of driving the word line.

In another aspect the present invention provides a semiconductor memory device, comprising: a reference voltage generator supplied with a first supply voltage and operative to generate a reference voltage higher than the first supply voltage; a voltage regulator operative to generate a second supply voltage higher than the first supply voltage based on the reference voltage; a logic circuit supplied with the first supply voltage; a cell array supplied with the second supply voltage and including plural mutually intersecting word lines and bit lines and plural memory cells connected at intersections thereof; and a word line driver operative to drive the word lines. The word line driver includes plural pull-up circuits connected between the supply terminal of the first supply voltage and the drive terminal of the word line and between the supply terminal of the second supply voltage and the drive terminal of the word line, and a pull-down circuit connected between the drive terminal of the word line and the ground terminal, and drives the word line with an intermediate voltage between the first and second supply voltages in accordance with a driving force ratio between the plural pull-up circuits at the time of driving the word line.

In another aspect the present invention provides a semiconductor memory device, comprising: a first reference voltage generator operative to generate a first reference voltage; a first voltage regulator supplied with the first reference voltage and operative to generate a first supply voltage based on the first reference voltage; a second reference voltage generator supplied with the first supply voltage and operative to generate a second reference voltage higher than the first supply voltage; a second voltage regulator operative to generate a second supply voltage higher than the first supply voltage based on the second reference voltage; a logic circuit supplied with the first supply voltage; a cell array supplied with the second supply voltage and including plural mutually intersecting word lines and bit lines and plural memory cells connected at intersections thereof; and a word line driver operative to drive the word lines. The word line driver includes plural pull-up circuits connected between the supply terminal of the first supply voltage and the drive terminal of the word line and between the supply terminal of the second supply voltage and the drive terminal of the word line, and a pull-down circuit connected between the drive terminal of the word line and the ground terminal, and drives the word line with an intermediate voltage between the first and second supply voltages in accordance with a driving force ratio between the plural pull-up circuits at the time of driving the word line.

DETAILED DESCRIPTION OF THE EMBODIMENTS

The embodiments associated with the semiconductor memory device according to the present invention will now be described with reference to the drawings.

First Embodiment

Figure 1:
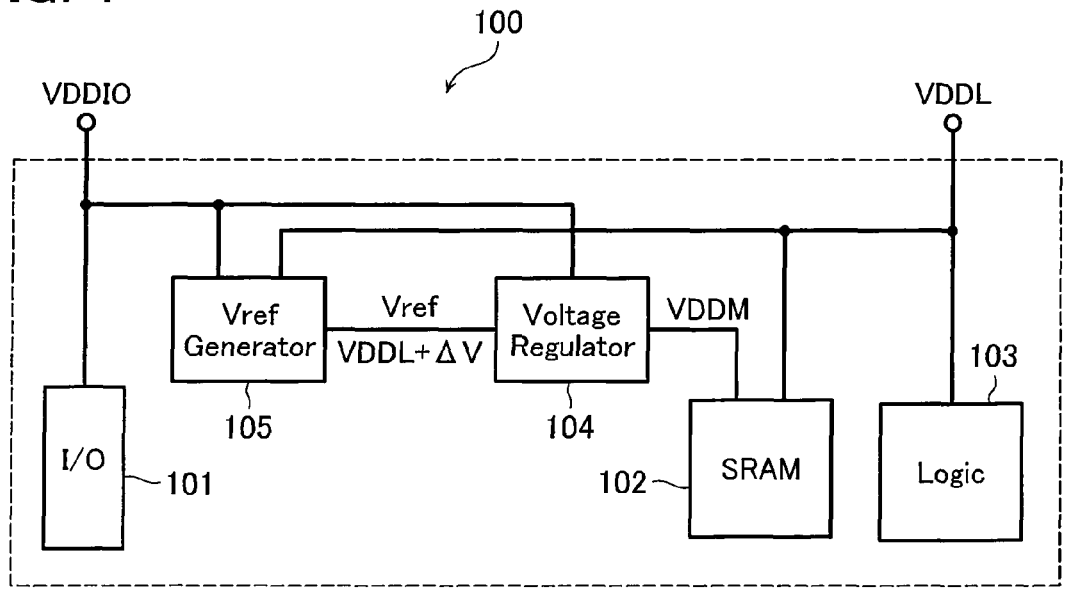
FIG. 1 is a block diagram of an LSI using a semiconductor memory device according to a first embodiment of the present invention.

FIG. 1 is a block diagram of an LSI using a semiconductor memory device according to a first embodiment of the present invention.

The LSI 100 comprises an I/O circuit 101 for use in data communications with external, an SRAM 102 that is a semiconductor memory device to store data therein, and a logic circuit 103 having other functions. The LSI 100 is supplied with a logic-use voltage VDDL that is a first supply voltage for driving peripheral circuits such as a row decoder in the SRAM 102 and the logic circuit 103, and an I/O-use voltage VDDIO for driving the I/O circuit 101. The I/O-use voltage VDDIO is a voltage higher than the logic-use voltage VDDL. For example, if the logic-use voltage VDDL=0.9 V, the I/O-use voltage is VDDIO=2.5 V.

The LSI 100 further comprises a voltage regulator 104 operative to generate a memory cell-use voltage VDDM that is a second supply voltage for driving the SRAM 102, and a reference voltage generator 105 operative to generate a reference voltage Vref, which is supplied to the voltage regulator 104 for generating the memory cell-use voltage VDDM. The reference voltage Vref is a voltage controlled higher by a certain level ΔV than the logic-use voltage VDDL. For example, if the logic-use voltage VDDL=0.9V and ΔV=0.2V, the reference voltage is controlled to Vref=1.1V. In this case, the voltage regulator 104 generates the memory cell-use voltage VDDM=1.1 V based on the reference voltage Vref.

The SRAM 102 is described next.

Figure 2:
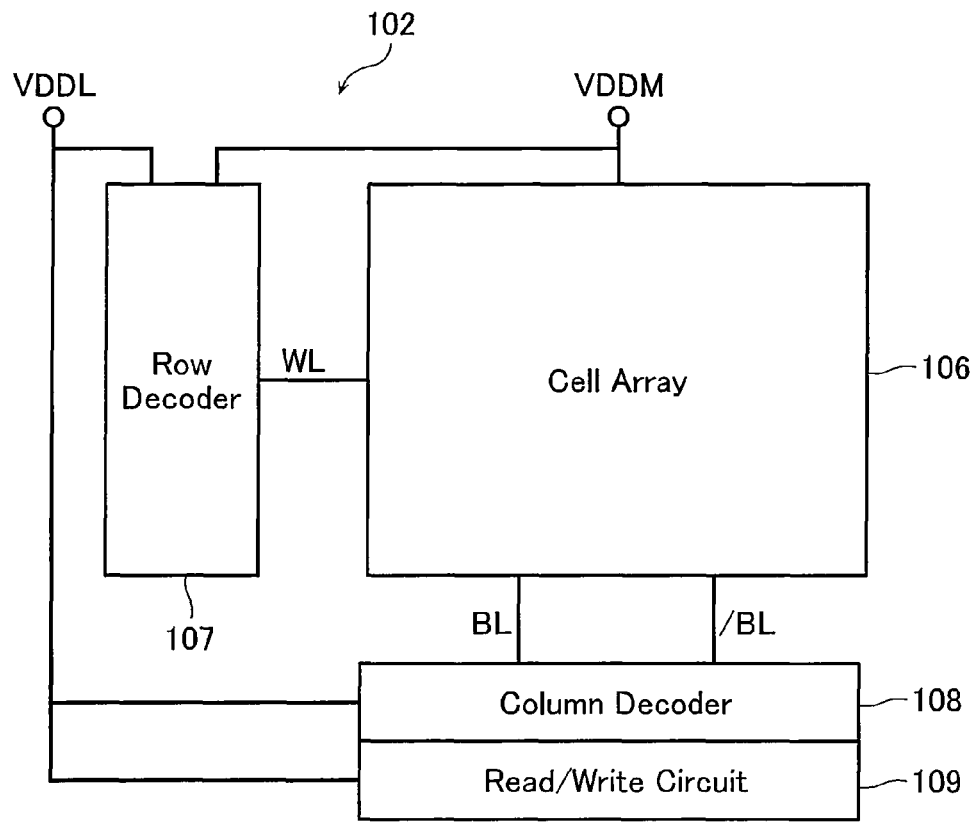
FIG. 2 is a block diagram of the same semiconductor memory device.

FIG. 2 is a block diagram of the SRAM 102 in the present embodiment.

The SRAM 102 comprises a cell array 106, which includes plural mutually intersecting word lines WL and plural first and second bit lines BL, /BL, and plural memory cells connected at intersections thereof. It also comprises a row decoder 107 including a word line driver operative to select and drive the word line WL, and a column decoder 108 operative to select the bit lines BL, /BL. It further comprises a read/write circuit 109 operative to read and write data to/from a certain memory cell via the column decoder 108 and the bit lines BL, /BL.

The logic-use voltage VDDL applied to the SRAM 102 is utilized in driving the row decoder 107, the column decoder 108 and the read/write circuit 109. On the other hand, the memory cell-use voltage VDDM is utilized in driving the cell array 106 and the row decoder 107.

The circuit in the cell array 106 is described next.

Figure 3:
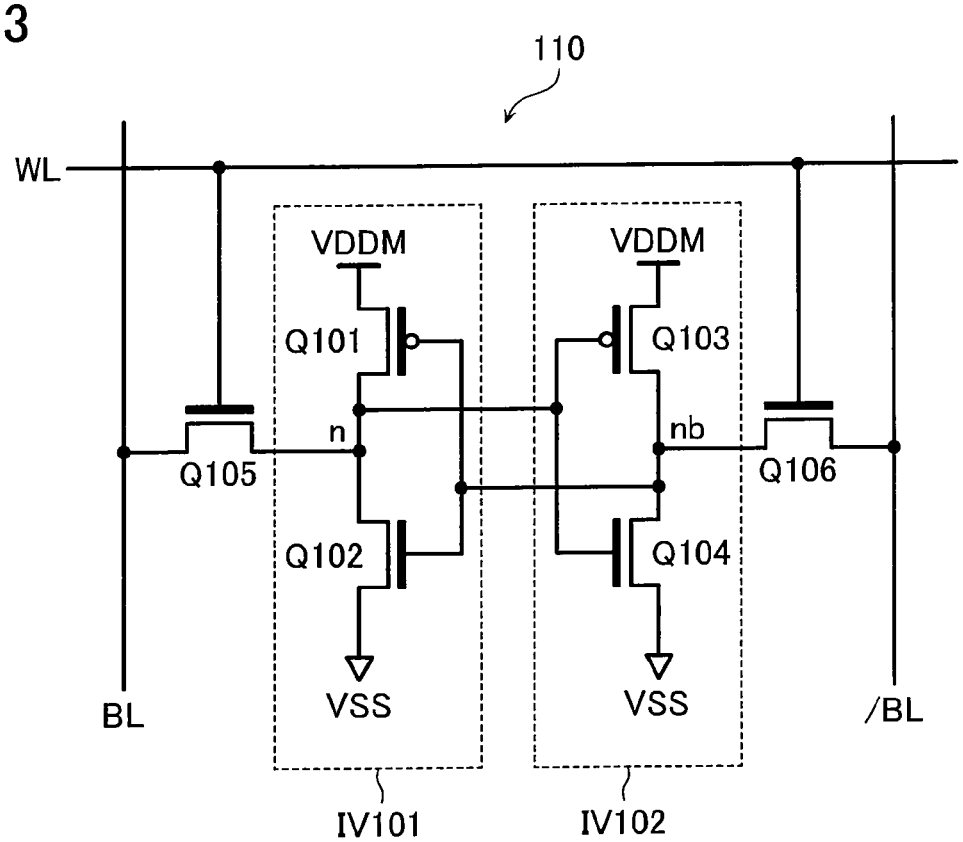
FIG. 3 is a circuit diagram of a memory cell in the same semiconductor memory device.

FIG. 3 is a circuit diagram of a memory cell contained in the cell array 106 of the present embodiment.

The memory cell is a memory cell 110 of the 6-transistor type, for example. Namely, it comprises a first inverter IV101 including a PMOS transistor Q101 and an NMOS transistor Q102 connected in a complementary pair, of which respective sources are connected to the supply line at the memory cell-use voltage VDDM level and to the ground line at the ground voltage VSS level. It also comprises a second inverter IV102 including a PMOS transistor Q103 and an NMOS transistor Q104 connected in a complementary pair, of which respective sources are connected to the supply line at the memory cell-use voltage VDDM level and to the ground line at the ground voltage VSS level. These inverters IV101, IV102 have cross-connected inputs and outputs. Between the bit line BL and the output terminal of the inverter IV101, a first transfer transistor, that is, an NMOS transistor Q105 is connected. Between the bit line /BL and the output terminal of the inverter IV102, a second transfer transistor, that is, an NMOS transistor Q106 is connected. The NMOS transistors Q105, Q106 have respective gates connected to the word line WL. Writing in the memory cell 110 of the 6-transistor type is executed with both the bit lines BL, /BL while reading may be executed from only one bit line BL as in single-ended reading.

Figure 4:
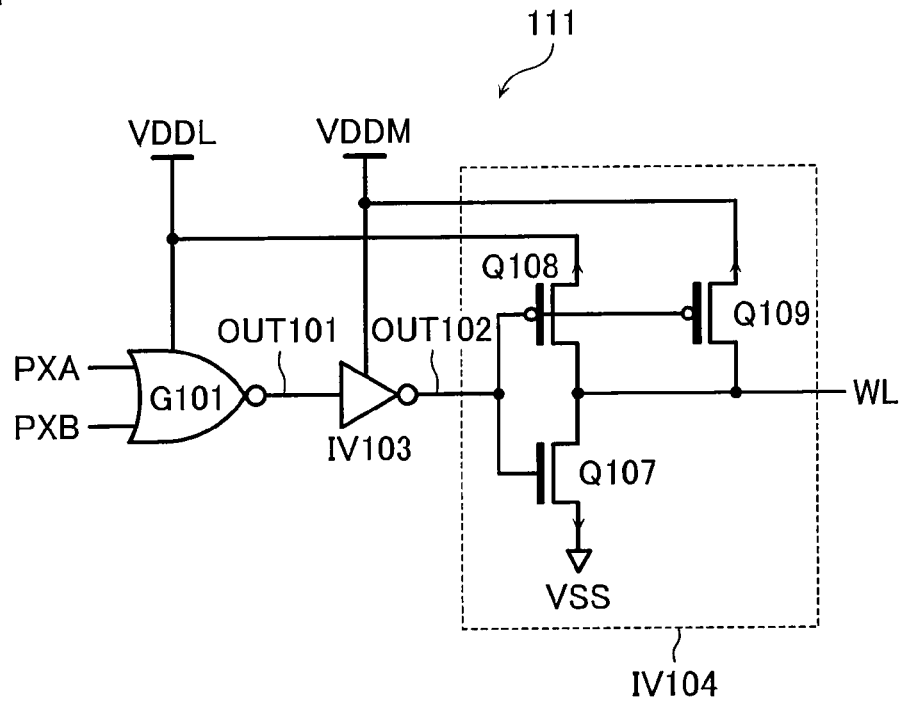
FIG. 4 is a circuit diagram of a word line driver in the same semiconductor memory device.

FIG. 4 is a circuit diagram of the word line driver contained in the row decoder 107 of the present embodiment.

The word line driver 111 comprises a NOR gate G101 driven with the logic-use voltage VDDL and operative to receive row decode signals PXA and PXB for selecting a certain word line WL, and an inverter IV103 driven with the memory cell-use voltage VDDM and operative to receive the output OUT101 from the NOR gate G101. It further includes an inverter IV104, which receives the output OUT102 from the inverter IV103, and of which output terminal is connected to the word line WL.

The inverter IV104 includes, as a pull-down circuit, an NMOS transistor Q107 connected between the ground line at the ground voltage VSS level and the word line WL. It also includes, as pull-up circuits, a PMOS transistor Q108 connected between the supply line at the logic-use voltage VDDL level and the word line WL, and a PMOS transistor Q109 connected between the supply line at the memory cell-use voltage VDDM level and the word line WL and in parallel with the PMOS transistor Q108. These NMOS transistor Q107 and PMOS transistors Q108 and Q109 have respective gates, which are supplied with the output OUT102 from the inverter IV103.

The following description is given to operation of the above-configured word line driver 111 at the time of selecting the word line WL.

Figure 5:
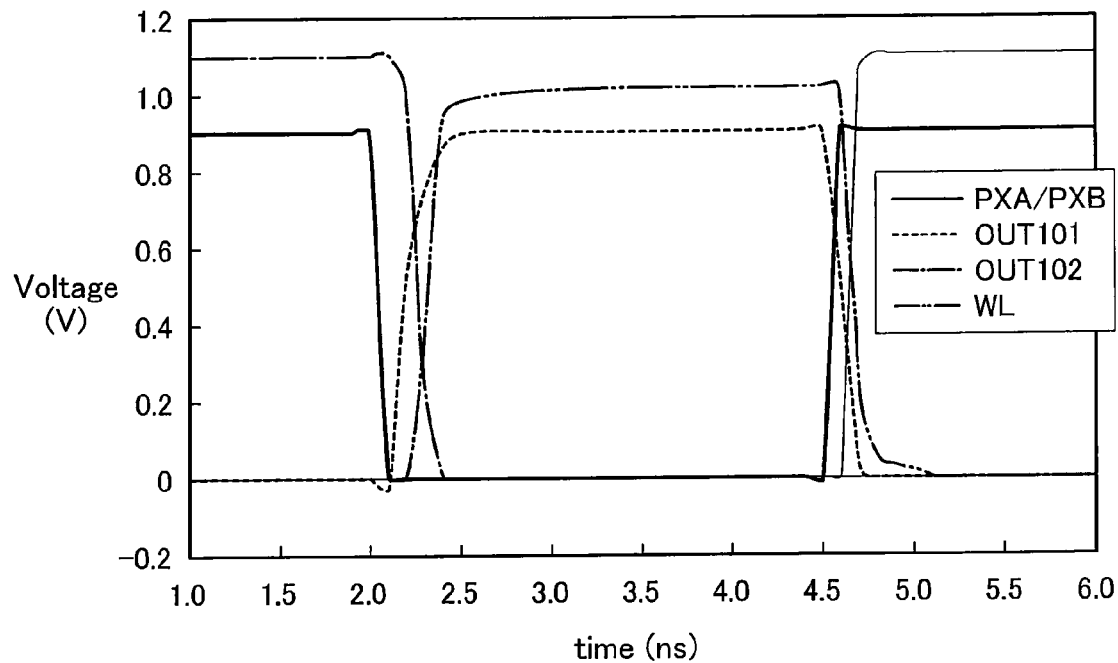
FIG. 5 is a graph showing operation waveforms of the word line driver in the same semiconductor memory device.

FIG. 5 is a graph showing operation waveforms in the word line driver 111 of the present embodiment with the logic-use voltage VDDL=0.9 V and the memory cell-use voltage VDDM=1.1 V.

The word line driver 111 operative to select the word line WL is given the row decode signals PXA and PXB both at "L", which are fed to the NOR gate G101. Thus, the output OUT101 from the NOR gate G101 turns "H" and the output OUT102 from the inverter IV103 turns "L". As a result, the NMOS transistor Q107 in the pull-down circuit is turned off to cut off the word line WL from the ground line. On the other hand, the PMOS transistors Q108 and Q109 are turned off to supply the logic-use voltage VDDL and the memory cell-use voltage VDDM to the word line WL. In this example, the selection level on the word line WL can be determined by the ratio between the driving forces of the PMOS transistors Q108 and Q109. Specifically, if the driving forces of the PMOS transistors Q108 and Q109 are denoted with DF1 and DF2, the selection level on the word line WL can be represented by (VDDL×DF1+VDDM×DF2)/(DF1+DF2). FIG. 5 provides a graph of operation waveforms when the PMOS transistors Q108 and Q109 have the same driving force. As can be found from this figure, the selection level on the word line WL is at 1.0 V, that is, an intermediate level between the logic-use voltage VDDL and the memory cell-use voltage VDDM.

The following description is given to data reading in the SRAM 102 thus configured. In this example, storage nodes n and nb hold "H" (the memory cell-use voltage VDDM level=1.1 V) and "L" (the ground voltage VSS level=0.0 V), respectively. Therefore, in the memory cell 110, the transistors Q101, Q104 are turned on and the transistors Q102, Q103 are turned off.

Before selection of the word line WL, the bit lines BL and /BL are precharged to the logic-use voltage VDDL level (0.9 V) by a precharge circuit contained in the read/write circuit 109.

In this state, when the word line WL is selected, the word line WL is brought to the selection level (1.0 V). In this case, no lager potential difference than the threshold voltage of the NMOS transistor Q105 arises between the word line WL and the storage node n. Therefore, the NMOS transistor Q105 is kept in the off-state. On the other hand, a lager potential difference than the threshold voltage of the NMOS transistor Q106 arises between the word line WL and the storage node nb. Therefore, the NMOS transistor Q106 is turned on. As a result, the bit line /BL is connected to the ground line via the turned-on transistors Q106, Q104 to pull down the bit line /BL to the ground voltage VSS level.

Through the above operation, the data in the memory cell 110 appeared as the potential difference between the bit lines BL and /BL is sensed and amplified at a sense amplifier circuit contained in the read/write circuit 109 and then read out to external. At this time, the bit line /BL precharged to the logic-use voltage VDDL floats the storage node nb above the ground voltage VSS and brings it into an unstable state. A large extent of floating of the storage node nb may invert the memory cell 110 and destruct the stored data possibly.

Figure 6:
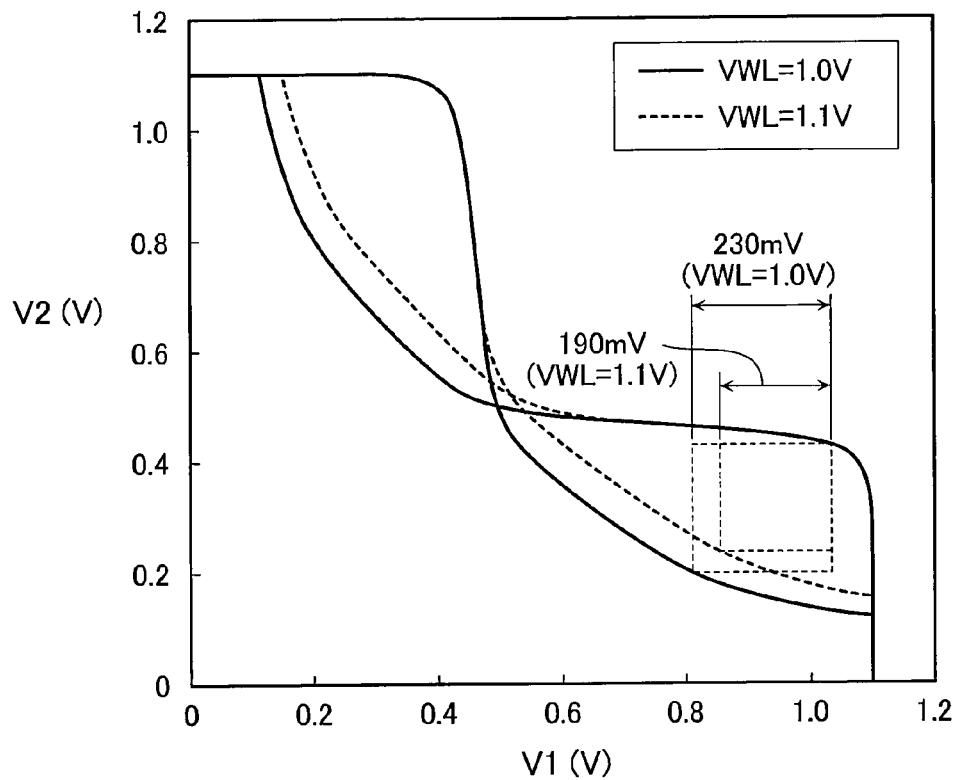
FIG. 6 shows a butterfly curve associated with the same semiconductor memory device.

FIG. 6 shows a butterfly curve, which visibly represents whether the data held on the storage nodes n, nb in the memory cell 110 of the present embodiment can be read with stability or not. For comparison with the present embodiment, it additionally shows a butterfly curve associated with a memory cell according to the prior art of which selection level VWL on the word line WL is determined at 1.1 V, that is, the same level as the memory cell-use voltage VDDM.

A butterfly curve is depicted by superimposing the characteristics of two inverters IV101 and IV102 contained in a flip-flop one on another, with mutual inputs and outputs crossed, when the word line WL is selected while the levels on the bit lines BL, /BL are both kept at the logic-use voltage VDDL.

The length of one side of an inscribed square shown with the dotted line in FIG. 6 is called a static noise margin (hereinafter referred to as SNM) and used as the measure of stability of the flip-flop.

As shown in FIG. 6, the SNM is 190 mV when the selection level VWL on the word line WL is determined at 1.1 V that is same as the memory cell-use voltage VDDM. In contrast, the SNM becomes 230 mV with an improvement of 40 mV when the selection level VWL on the word line WL is lowered to 1.0 V.

As obvious from the above, in accordance with the present embodiment, it is possible to provide a semiconductor memory device with improved stability of data reading in the memory cell 110 by determining the selection level VWL on the word line WL at the intermediate level between the logic-use voltage VDDL and the memory cell-use voltage VDDM.

The intermediate level can be determined by the ratio between the driving forces of the PMOS transistors Q108 and Q109. The driving forces mainly depend on the channel length and the channel width of the transistor. With this regard, even if the LSI process itself has variations, the variations in the process for the successively arrangeable PMOS transistors Q108 and Q109 are both almost same in many cases and the driving force ratio itself has no large fluctuation. In a word, it can be said that the circuitry is not susceptible to the process variations.

The general word line driver according to the prior art uses plural pull-up transistors connected in parallel to ensure the driving force in many cases. Though, it is sufficient to connect the sources of the pull-up transistors to the logic-use voltage VDDL and the memory cell-use voltage VDDM. Accordingly, the chip area is not made larger than the word line driver according to the prior art.

Second Embodiment

Figure 7:
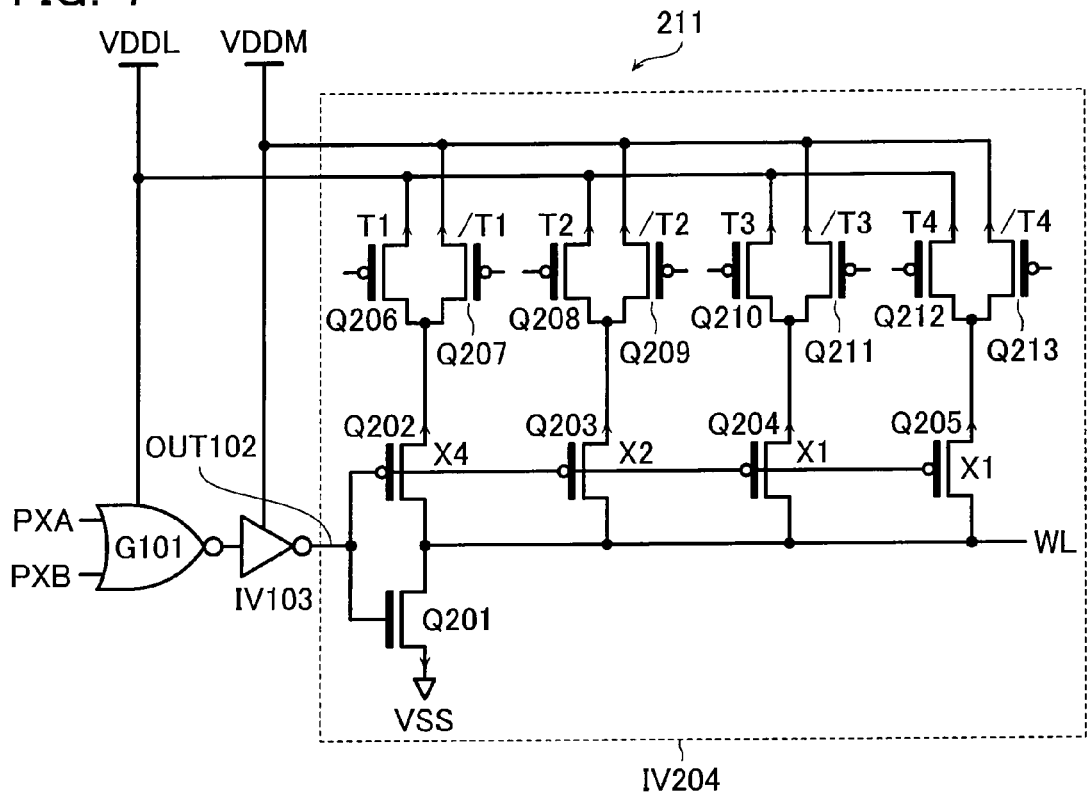
FIG. 7 is a circuit diagram of a word line driver in a semiconductor memory device according to a second embodiment of the present invention.

FIG. 7 is a circuit diagram of a word line driver in a semiconductor memory device according to a second embodiment of the present invention.

The word line driver 211 of the present embodiment comprises an inverter IV204 in place of the inverter IV104 at the final stage in the word line driver 111 of the first embodiment.

The pull-down circuit in the inverter IV204 includes an NMOS transistor Q201 connected between the ground line at the ground voltage VSS level and the word line WL.

On the other hand, the pull-up circuit includes four PMOS transistors Q202-Q205 having respective drains connected to the word line WL. If the driving force of the PMOS transistor Q205 is equal to 1, the driving forces of the PMOS transistors Q202-Q204 are equal to 4, 2 and 1, respectively. These PMOS transistors Q202-Q205 have respective sources, which are respectively connected to the supply line at the logic-use voltage VDDL level via PMOS transistors Q206, Q208, Q210 and Q212 and selectively connected to the supply line at the memory cell-use voltage VDDM level via PMOS transistors Q207, Q209, Q211 and Q213. The PMOS transistors Q206 and Q207 have respective gates, which are controlled by a trimming signal T1 and the reverse logic /T1. Similarly, the PMOS transistors Q208 and Q209, Q210 and Q211, Q212 and Q213 are controlled by trimming signals T2 and /T2, T3 and /T3, T4 and /T4, respectively. In accordance with the trimming signals T1-T4, /T1-/T4, the PMOS transistors Q202-Q205 are switched as the circuits for pulling up the word line WL to either the logic-use voltage VDDL or the memory cell-use voltage VDDM.

The NMOS transistor Q201 in the pull-down circuit and the PMOS transistors Q202-Q205 in the pull-up circuit have respective gates, which are supplied with the output OUT102 from the inverter IV103.

Operation of the word line driver 211 is described next.

When the row decode signals PXA and PXB based on an address fed from external are both at "L", the output from the NOR gate G101 is at "H" and the output OUT102 from the inverter IV103 is at "L". Therefore, the PMOS transistors Q202-Q205 in the pull-up circuit are turned on and the NMOS transistor Q201 in the pull-down circuit is turned off.

When the trimming signals are T1="H" (/T1="L"), T2="L" (/T2="H"), T3="H" (/T3="L"), T4="L" (/T4="H"), the PMOS transistors Q203, Q205 serve as the pull-up circuit to supply the logic-use voltage VDDL to the word line WL, and the PMOS transistors Q202, Q204 serve as the pull-up circuit to supply the memory cell-use voltage VDDM to the word line WL. Therefore, they have a ratio of 3:5 between the driving forces. As a result, the selection level on the word line WL roughly becomes VWL=1.025 V.

Similarly, when the trimming signals are T1="H" (/T1="L"), T2="L" (/T2="H"), T3="L" (/T3="H"), T4="L" (/T4="H"), the PMOS transistors Q203, Q204, Q205 serve as the pull-up circuit to supply the logic-use voltage VDDL to the word line WL, and the PMOS transistors Q202 serves as the pull-up circuit to supply the memory cell-use voltage VDDM to the word line WL. Therefore, they have a ratio of 4:4 between the driving forces. As a result, the selection level on the word line WL roughly becomes VWL=1.0 V.

As can be found from the above, the word line driver 211 can trim the selection level VWL on the word line WL roughly in a unit of 0.025 V with combinations of the trimming signals T1-T4, /T1-/T4.

Figure 8:
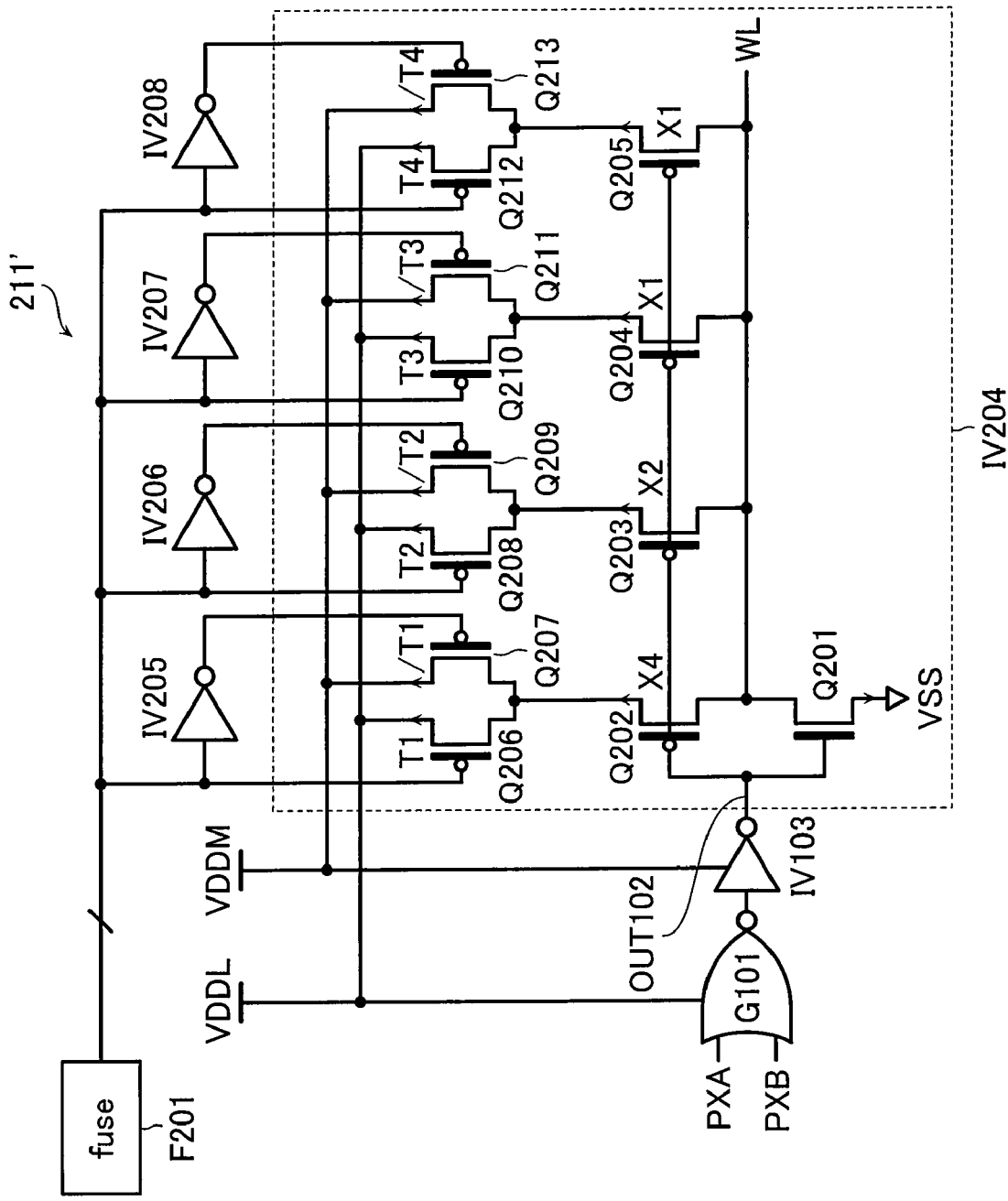
FIG. 8 is a circuit diagram of another word line driver in the semiconductor memory device according to the second embodiment of the present invention.

The trimming signals T1-T4 (/T1-/T4) may be set with a 4-bit memorable fuse F201, for example, as shown in FIG. 8. In this case, the fuse F201 can be programmed to set an optimal word line level depending on the situation of the process.

Figure 9:
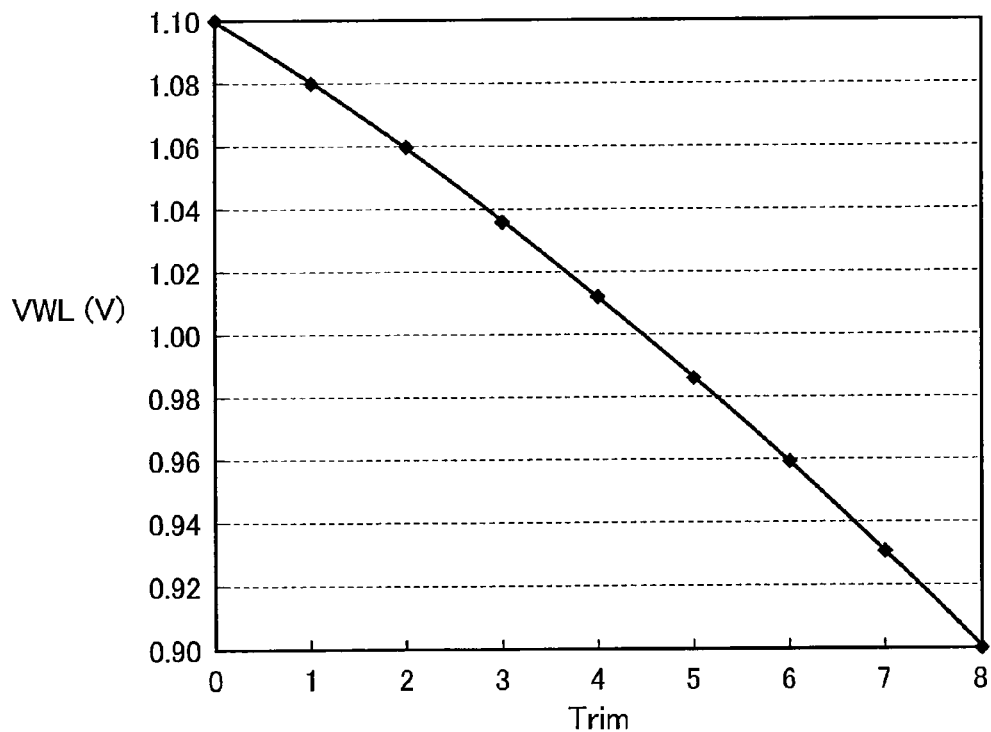
FIG. 9 is a graph showing a relation between the trimming value in the word line driver and the selection level on the word line in the same semiconductor memory device.

FIG. 9 is a graph depicted by plotting actually measured values of the selection level VWL on the word line WL and the trimming values Trim in the word line driver 211 shown in FIG. 7. The trimming values Trim are values indicative of the driving force of the pull-up circuit for pull-up to the logic-use voltage VDDL when the entire pull-up circuit has a driving force of 8.

Logically, when the trimming value is Trim=0, the selection level on the word line WL becomes VWL=1.1 V, and when the trimming value is Trim=8, the selection level on the word line WL becomes VWL=0.9 V.

With this regard, although the presence of the process-caused variations in the PMOS transistors Q202-Q205 protrudes the line more or less in practice, the graph is almost linear as can be observed.

A lowered selection level VWL on the word line WL increases the stability but deteriorates the write characteristic in contrast. Therefore, it is important to set an optimal selection level VWL on the word line WL, taking the balance between the stability of data and the write characteristic into account, in order to provide a low-voltage SRAM. The variation in process may cause the threshold voltages of the PMOS transistor and the NMOS transistor to fluctuate and disturb the balance between the stability of data and the write characteristic possibly.

With this regard, in accordance with the present embodiment, it is possible to trim the selection level VWL on the word line WL in stages and accordingly set a selection level VWL on the word line WL that can optimize the above balance.

As for implementations, the PMOS transistors contained in the pull-up circuit can be arranged in close places. Accordingly, it is possible to provide a semiconductor memory device resistive to the variation in process, like in the first embodiment.

Figure 10:
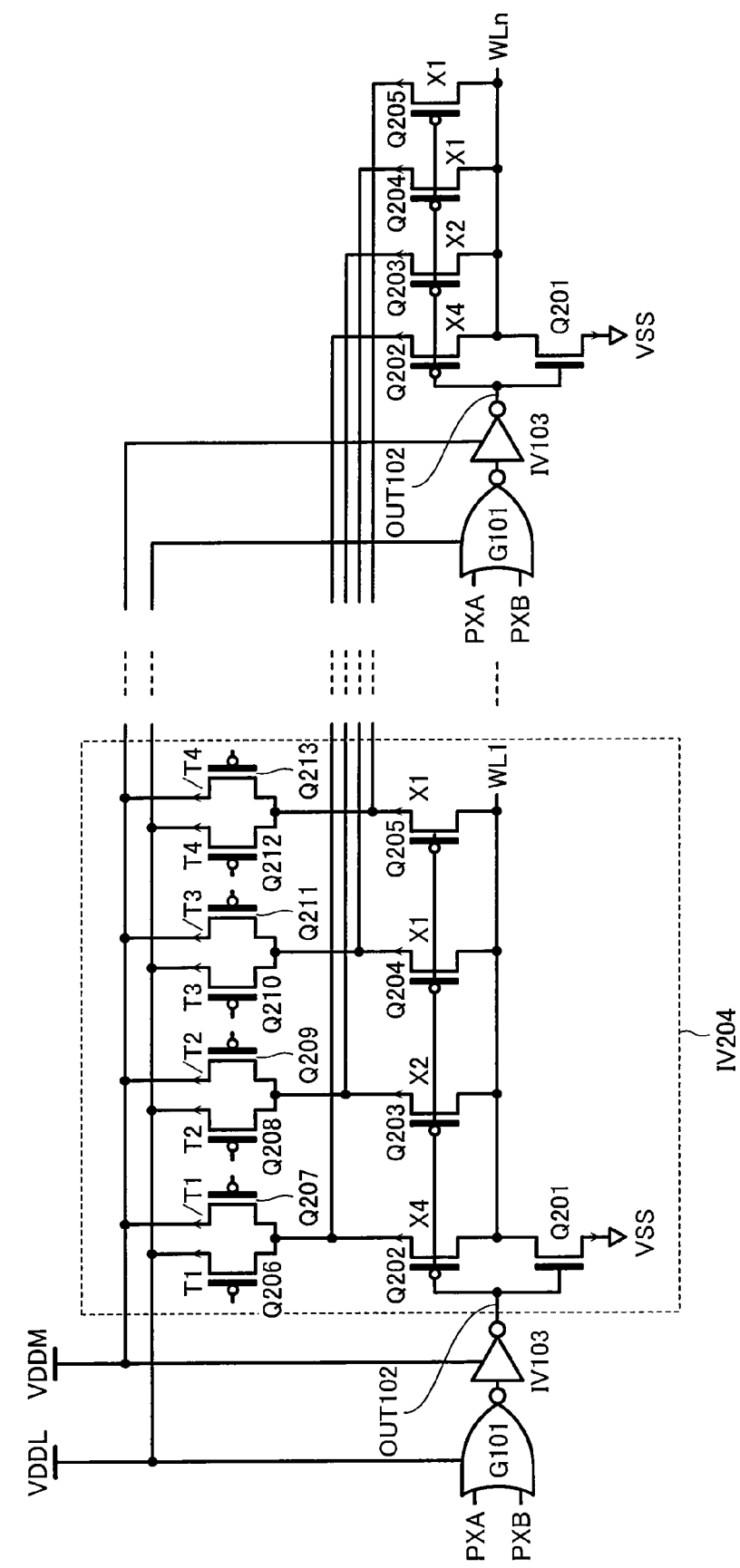
FIG. 10 is a circuit diagram of another word line driver in the same semiconductor memory device.

The PMOS transistors Q206-Q213 are contained in one word line driver in FIG. 7 though they may be shared by plural word line drivers as shown in FIG. 10.

Third Embodiment

In the second embodiment, the selection level VWL on the word line WL is trimmed to optimize the balance between the stability of data and the write characteristic of the memory cell 110 as considered.

In a third embodiment of the present invention, the write characteristic is improved through another method to shift the point of balance between the stability of data and the write characteristic of the memory cell to that at a much lower voltage.

Figure 11:
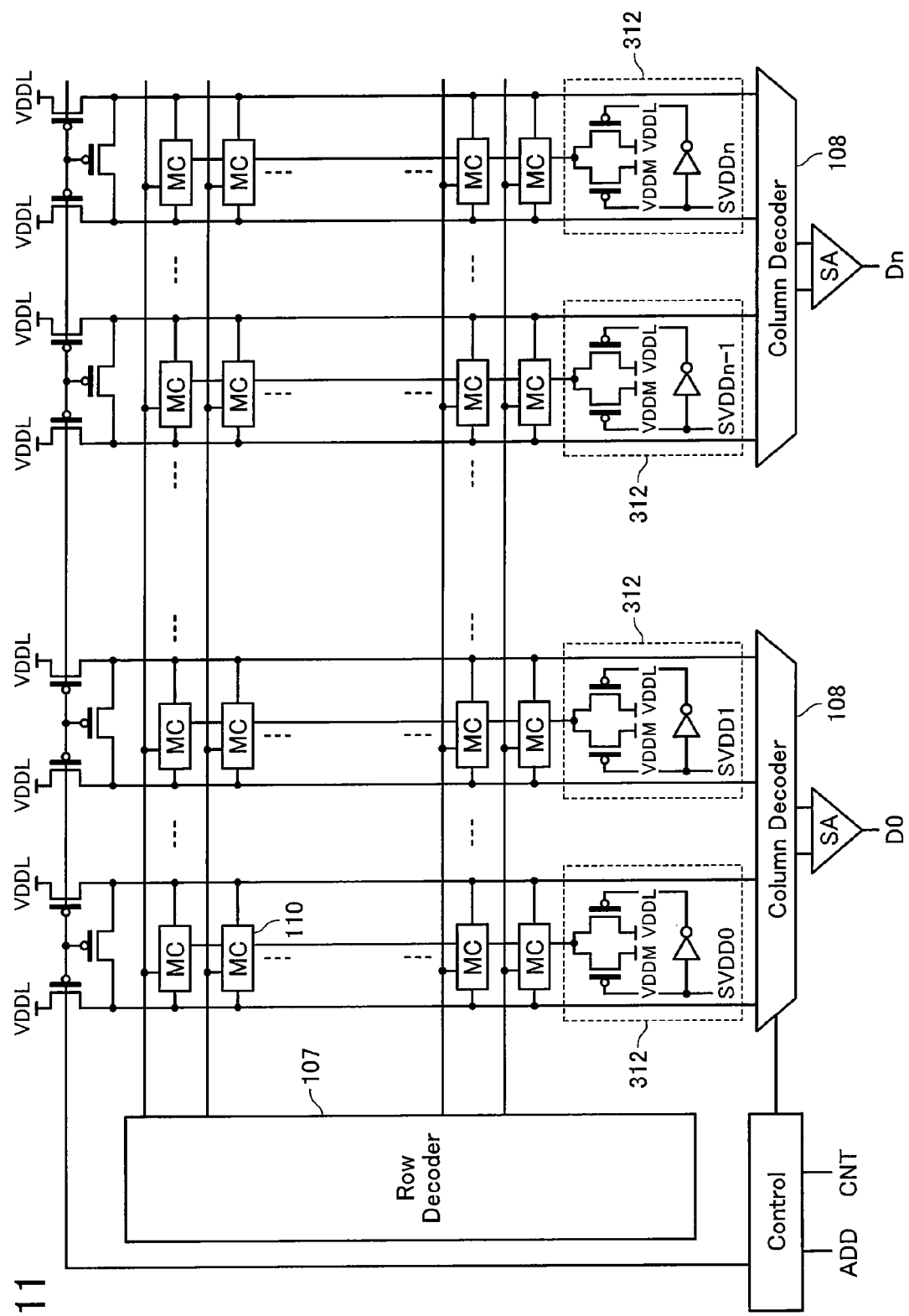
FIG. 11 is a block diagram of a semiconductor memory device according to a third embodiment of the present invention.

FIG. 11 is a block diagram of a semiconductor memory device according to a third embodiment of the present invention.

The present embodiment is configured to additionally comprise memory cell power control circuits 312 each arranged between the bit line pair composed of bit lines BL and /BL in the SRAM 102 shown in FIG. 1.

The memory cell power control circuit 312 includes two PMOS transistors having respective sources connected to the supply lines at the logic-use voltage VDDL and the memory cell-use voltage VDDM and respective drains connected in common. The connected drains of the PMOS transistors are connected to the PMOS transistors Q101 and Q103 in the memory cell 110. The two PMOS transistors have respective gates, which are supplied with a memory cell power selection signal SVDD and the inverted signal thereof.

The circuit thus configured is controlled by the memory cell power selection signal SVDD to supply the memory cell-use voltage VDDM to the flip-flop in the memory cell 110 when the memory cell power selection signal SVDD="L" and supply the logic-use voltage VDDL to the flip-flop in the memory cell 110 when the memory cell power selection signal SVDD="H".

In accordance with the present embodiment, the flip-flop in the memory cell 110 can be supplied with the memory cell-use voltage VDDM in normal times and with the logic-use voltage VDDL only at the time of write. In this case, the voltage on the storage node n or nb in the "H"-holding memory cell becomes the logic-use voltage VDDL. Accordingly, it can be inverted to "L" easier than when it is at the higher memory cell-use voltage VDDM. In a word, it is possible to provide a semiconductor memory device having a further improved write characteristic while keeping the effects of the first and second embodiments.

Fourth Embodiment

Figure 12:
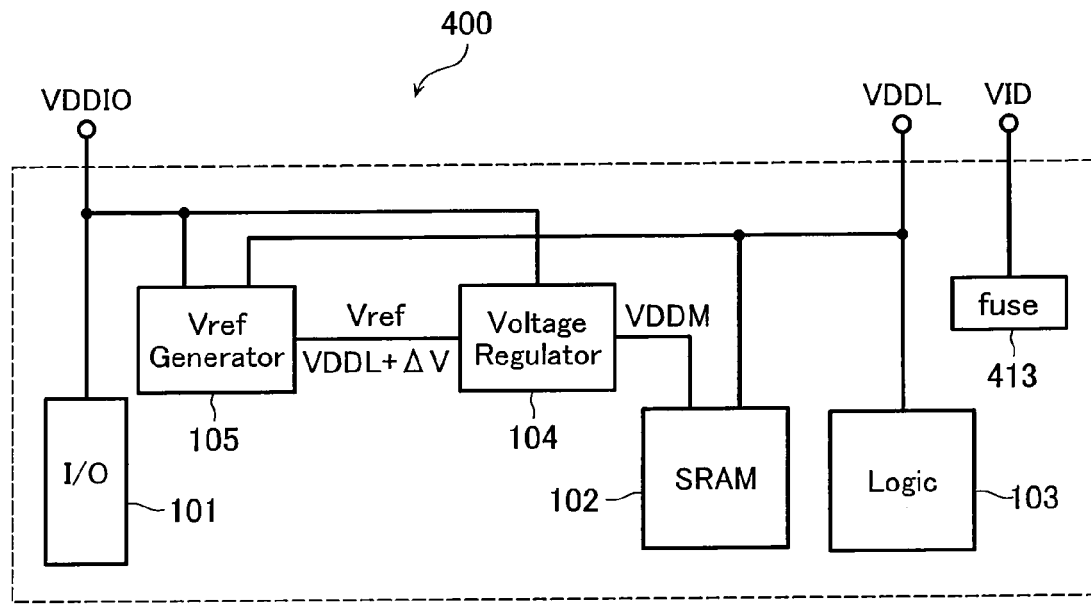
FIG. 12 is a block diagram of an LSI using a semiconductor memory device according to a fourth embodiment of the present invention.

FIG. 12 is a block diagram of an LSI according to a fourth embodiment of the present invention.

The present embodiment is configured to comprise a VID (Voltage-ID) output function as a control means for the logic-use voltage VDDL in addition to the LSI in the first embodiment. The VID is determined in accordance with the leak current and operation speed of the LSI and used to control the logic-use voltage VDDL supplied from outside the LSI. The VID is set by a fuse 413 provided inside the LSI.

Figure 13:
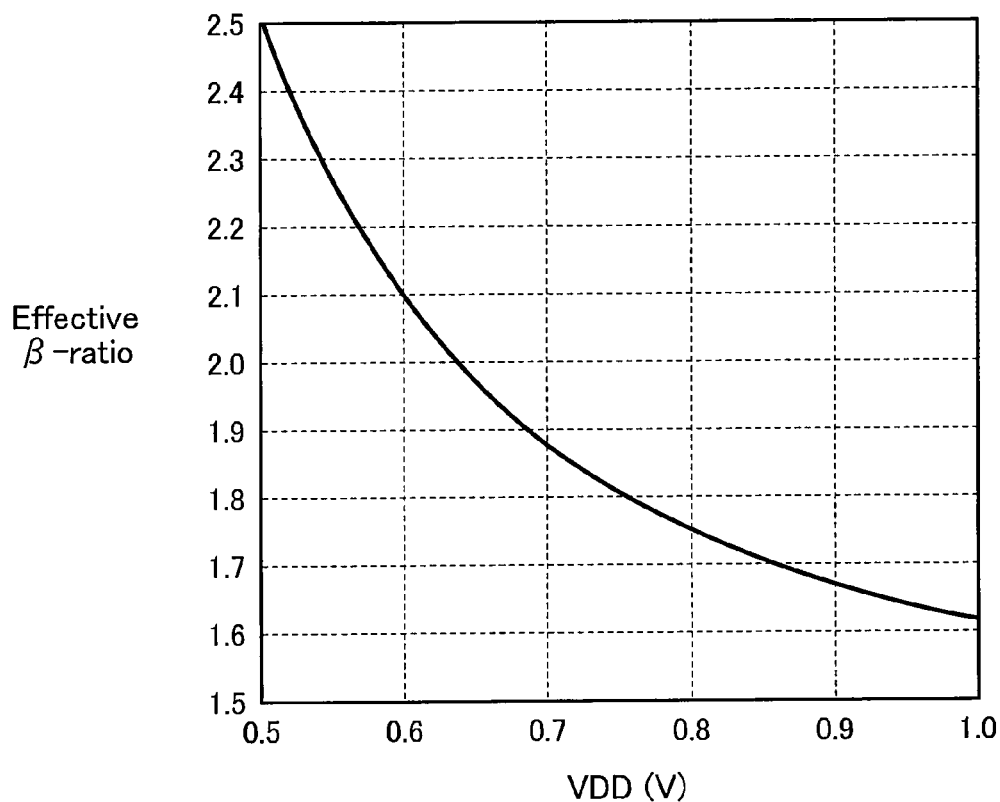
FIG. 13 is a graph showing a relation between the supply voltage and the effective β-ratio in the same semiconductor memory device.

FIG. 13 is a graph showing a relation between the logic-use voltage VDDL and the effective β-ratio in the memory cell of the present embodiment. The effective β-ratio is a ratio between driving forces of the driver NMOS transistor Q102 (or Q104) and the transfer NMOS transistor Q105 (or Q106) in the memory cell 110.

The memory cell-use voltage VDDM supplied to the flip-flop in the memory cell 110 of the present embodiment is a voltage higher by a certain voltage ΔV than the logic-use voltage VDDL, and the selection level VWL on the word line WL is an intermediate voltage between the memory cell-use voltage VDDM and the logic-use voltage VDDL. Therefore, the lower the logic-use voltage VDDL becomes, the higher the effective β-ratio rises. A higher effective β-ratio means that the driver NMOS transistor Q102 (or Q104) has a higher driving force, which achieves higher stability at the time of reading data from the memory cell 110. On the other hand, a lower effective β-ratio means the transfer NMOS transistor Q105 (or Q106) has a higher driving force, which improves the characteristic of writing data in the memory cell 110.

In general, a lower threshold voltage of the transistor contained in the memory cell 110 facilitates the storage nodes n, nb to be pulled up at the time of data read and deteriorates the stability. In addition, the lower threshold voltage of the transistor increases the leak current through the chip and accordingly requires a VID setting that lowers the logic-use voltage VDDL. In the case of the present embodiment, selection of a lower logic-use voltage VDDL elevates the effective β-ratio, which improves the stability as a result. On the other hand, a higher threshold voltage of the transistor deteriorates the data write characteristic. In addition, the higher threshold voltage of the transistor slows the operation speed of the chip and accordingly requires a VID setting that elevates the logic-use voltage VDDL. In the case of the present embodiment, selection of a higher logic-use voltage VDDL lowers the effective β-ratio, which improves the data write characteristic as a result.

In accordance with the present embodiment, the word line WL is set at the intermediate potential between the logic-use voltage VDDL and the memory cell-use voltage VDDM to exert the same effects as those in the first through third embodiments. In addition, the effective β-ratio varies in a self-controlled manner in engagement with the VID-based trimming of the logic-use voltage VDDL. Accordingly, it is possible to balance the stability and the write characteristic at the time of data reading and thus provide a semiconductor memory device of which voltage is lowered as a whole.

Fifth Embodiment

Figure 14:
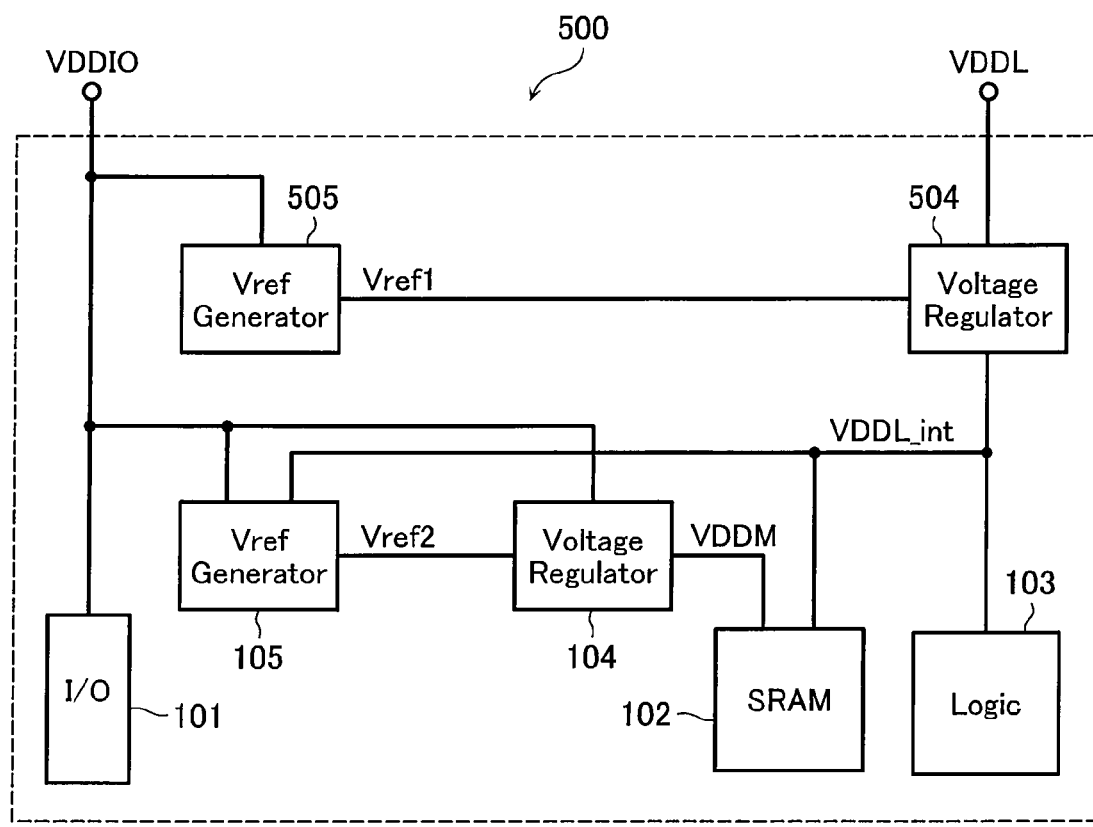
FIG. 14 is a block diagram of an LSI using a semiconductor memory device according to a fifth embodiment of the present invention.

FIG. 14 is a block diagram of an LSI according to a fifth embodiment of the present invention.

The present embodiment comprises a first voltage regulator 504 and a first reference voltage generator 505 in addition to the LSI 100 shown in FIG. 1.

The reference voltage generator 505 steps down the I/O-use voltage VDDIO fed from external to generate a first reference voltage Vref1 for the logic-use voltage VDDL and supply it to the first voltage regulator 504. The first voltage regulator 504 given the first reference voltage Vref1 generates a logic-use voltage VDDL_int, that is, a first supply voltage for driving the logic circuit inside the LSI 500 and supplies it to the second reference voltage generator 105. The second reference voltage generator 105 given the logic-use voltage VDDL generates a second reference voltage Vref2 higher by a certain level than the logic-use voltage VDDL_int and supplies it to the second voltage regulator 104. Finally, the second voltage regulator 104 generates the memory cell-use voltage VDDM, that is, the second supply voltage, based on the second reference voltage Vref2 and supplies it to the SRAM 102.

In accordance with the present embodiment, it is possible to exert the same effects as those in the first through fourth embodiments. Further, the logic-use voltage VDDL uniformly given from external can be adjusted by the voltage regulator 504 and accordingly variations in characteristic of the LSI 500 among the individuals can be compensated for.

What is claimed is:

1. A semiconductor memory device, comprising:
   a logic circuit supplied with a first supply voltage;
   a cell array supplied with a second supply voltage higher than said first supply voltage and including plural mutually intersecting word lines and bit lines and plural memory cells connected at intersections thereof; and
   a word line driver operative to drive said word lines,
   wherein said word line driver includes plural pull-up circuits connected between a supply terminal of said first supply voltage and a drive terminal of said word line and between a supply terminal of said second supply voltage and the drive terminal of said word line, and a pull-down circuit connected between the drive terminal of said word line and a ground terminal, and drives said word line with an intermediate voltage between said first and second supply voltages in accordance with a driving force ratio between said plural pull-up circuits at a time of driving said word line.

2. The semiconductor memory device according to claim 1, wherein said word line driver is able to vary said driving force ratio between said plural pull-up circuits.

3. The semiconductor memory device according to claim 2, wherein said plural pull-up circuits include plural PMOS transistors connected in parallel to vary the voltage for driving said word line in accordance with a combination of on/off states of said plural PMOS transistors.

4. The semiconductor memory device according to claim 3, further comprising a fuse arranged to control on/off states of said plural PMOS transistors connected in parallel.

5. The semiconductor memory device according to claim 1, further comprising:
   a reference voltage generator supplied with said first supply voltage and operative to generate a reference voltage higher than said first supply voltage; and
   a voltage regulator operative to generate said second supply voltage based on said reference voltage and provide said second supply voltage to said cell array.

6. The semiconductor memory device according to claim 1, wherein said bit lines include pairs of complementary bit lines containing a first and a second bit line,
   said memory cells each include a first and a second inverter connected between a supply terminal of a memory cell-use voltage and the ground terminal and having mutually connected input/output terminals, a first transfer transistor connected between the output terminal of said first inverter and said first bit line and controlled by said word line, and a second transfer transistor connected between the output terminal of said second inverter and said second bit line and controlled by said word line.

7. The semiconductor memory device according to claim 6, further comprising a memory cell power control circuit operative to supply said first supply voltage to the supply terminals of the memory cell-use voltage in said memory cells belonging to a column that contains a write target memory cell and operative to supply said second supply voltage to the supply terminals of the memory cell-use voltage in other memory cells.

8. The semiconductor memory device according to claim 1, further comprising a control means operative to control said first supply voltage.

9. The semiconductor memory device according to claim 8, further comprising a fuse operative to hold a value for determining a level of said first supply voltage,
wherein said control means has a function of notifying about the value of said fuse to external.

10. A semiconductor memory device, comprising:
a reference voltage generator supplied with a first supply voltage and operative to generate a reference voltage higher than said first supply voltage;
a voltage regulator operative to generate a second supply voltage higher than said first supply voltage based on said reference voltage;
a logic circuit supplied with said first supply voltage;
a cell array supplied with said second supply voltage and including plural mutually intersecting word lines and bit lines and plural memory cells connected at intersections thereof; and
a word line driver operative to drive said word lines,
wherein said word line driver includes plural pull-up circuits connected between a supply terminal of said first supply voltage and a drive terminal of said word line and between a supply terminal of said second supply voltage and the drive terminal of said word line, and a pull-down circuit connected between the drive terminal of said word line and a ground terminal, and drives said word line with an intermediate voltage between said first and second supply voltages in accordance with a driving force ratio between said plural pull-up circuits at a time of driving said word line.

11. The semiconductor memory device according to claim 10, wherein said word line driver is able to vary said driving force ratio between said plural pull-up circuits.

12. The semiconductor memory device according to claim 11, wherein said plural pull-up circuits include plural PMOS transistors connected in parallel to vary the voltage for driving said word line in accordance with a combination of on/off states of said plural PMOS transistors.

13. The semiconductor memory device according to claim 10, wherein said bit lines include pairs of complementary bit lines containing a first and a second bit line,
said memory cells each include a first and a second inverter connected between a supply terminal of a memory cell-use voltage and a ground line and having mutually connected input/output terminals, a first transfer transistor connected between the output terminal of said first inverter and said first bit line and controlled by said word line, and a second transfer transistor connected between the output terminal of said second inverter and said second bit line and controlled by said word line.

14. The semiconductor memory device according to claim 13, further comprising a memory cell power control circuit operative to supply said first supply voltage to the supply terminals of the memory cell-use voltage in said memory cells belonging to a column that contains a write target memory cell and operative to supply said second supply voltage to the supply terminals of the memory cell-use voltage in other memory cells.

15. The semiconductor memory device according to claim 10, further comprising:
a fuse operative to hold a value for determining a level of said first supply voltage; and
a control means operative to notify about the value of said fuse to external.

16. A semiconductor memory device, comprising:
a first reference voltage generator operative to generate a first reference voltage;
a first voltage regulator supplied with said first reference voltage and operative to generate a first supply voltage based on said first reference voltage;
a second reference voltage generator supplied with said first supply voltage and operative to generate a second reference voltage higher than said first supply voltage;
a second voltage regulator operative to generate a second supply voltage higher than said first supply voltage based on said second reference voltage;
a logic circuit supplied with said first supply voltage;
a cell array supplied with said second supply voltage and including plural mutually intersecting word lines and bit lines and plural memory cells connected at intersections thereof; and
a word line driver operative to drive said word lines,
wherein said word line driver includes plural pull-up circuits connected between a supply terminal of said first supply voltage and a drive terminal of said word line and between a supply terminal of said second supply voltage and the drive terminal of said word line, and a pull-down circuit connected between the drive terminal of said word line and a ground terminal, and drives said word line with an intermediate voltage between said first and second supply voltages in accordance with a driving force ratio between said plural pull-up circuits at a time of driving said word line.

17. The semiconductor memory device according to claim 16, wherein said word line driver is able to vary said driving force ratio between said plural pull-up circuits.

18. The semiconductor memory device according to claim 17, wherein said plural pull-up circuits include plural PMOS transistors connected in parallel to vary the voltage for driving said word line in accordance with a combination of on/off states of said plural PMOS transistors.

19. The semiconductor memory device according to claim 16, wherein said bit lines include pairs of complementary bit lines containing a first and a second bit line,
said memory cells each include a first and a second inverter connected between a supply line of a memory cell-use voltage and the ground terminal and having mutually connected input/output terminals, a first transfer transistor connected between the output terminal of said first inverter and said first bit line and controlled by said word line, and a second transfer transistor connected between the output terminal of said second inverter and said second bit line and controlled by said word line.

20. The semiconductor memory device according to claim 19, further comprising a memory cell power control circuit operative to supply said first supply voltage to the supply terminals of the memory cell-use voltage in said memory cells belonging to a column that contains a write target memory cell and operative to supply said second supply voltage to the supply terminals of the memory cell-use voltage in other memory cells.

* * * * *